United States Patent [19]

Graul et al.

[11] B 4,001,465

[45] Jan. 4, 1977

[54] PROCESS FOR PRODUCING SEMICONDUCTOR DEVICES

[75] Inventors: Juergen Graul, Gruenwald; Helmuth Murrmann, Ottobrunn, both of Germany

[73] Assignee: Siemens Aktiengesellschaft, Berlin & Munich, Germany

[22] Filed: Feb. 28, 1975

[21] Appl. No.: 554,164

[44] Published under the second Trial Voluntary Protest Program on March 9, 1976 as document No. B 554,164.

[30] Foreign Application Priority Data

Mar. 1, 1974 Germany ............... 2409910

[52] U.S. Cl. .................... 148/187; 148/175; 357/50; 427/93; 427/94; 427/95; 428/446; 29/578; 156/17
[51] Int. Cl.² .................. H01L 21/76; H01L 27/04
[58] Field of Search ............ 427/93, 94, DIG. 12, 427/95; 156/17; 148/174, 175, 187; 29/578, 580, 590; 357/50; 428/446

[56] References Cited

UNITED STATES PATENTS

| | | | |
|---|---|---|---|
| 3,719,535 | 3/1973 | Zoroglu ................... | 148/187 |
| 3,755,014 | 8/1973 | Appels ..................... | 148/175 |
| 3,899,372 | 8/1975 | Esch ........................ | 156/17 |
| 3,900,350 | 8/1975 | Appels ..................... | 427/94 |

OTHER PUBLICATIONS

Rideout et al., *IBM Tech. Disclosure Bulletin*, "Fabricating .... Substrates," vol. 17, No. 3, pp. 949–951 (Aug. 1974).
Appels et al., *Phillips Research Reports*, "Local Oxidation of Silicon," No. 26, pp. 157–165 (1971).

*Primary Examiner*—Michael F. Esposito
*Attorney, Agent, or Firm*—Hill, Gross, Simpson, Van Santen, Steadman, Chiara & Simpson

[57] ABSTRACT

A ring or lattice-shaped groove or trench is etched into a surface of a Si monocrystal layer. At least one boundary of the so-etched groove or trench is coated with a strip-shaped layer of an oxidation-blocking material, such as $Si_3N_4$ and the area of the substrate adjacent to the $Si_3N_4$ layer and/or the substrate area enclosed by such layer is provided with a relatively thick $SiO_2$ layer which extends deeper into the Si surface than does the $SiN_4$ layer, while the Si surface within the groove or trench remains uncoated. The so-obtained arrangement is then thermally oxidized under conditions sufficient to at least partially fill the groove or trench with $SiO_2$. Thereafter, the oxidation-blocking layer and at least a part of the $SiO_2$ layer which is outside the ring or lattice-shaped trench is removed by a suitable etchant from the monocrystalline surface and the thus uncovered Si surface is further processed to produce small pn-junctions.

11 Claims, 5 Drawing Figures

PROCESS FOR PRODUCING SEMICONDUCTOR DEVICES

BACKGROUND OF THE INVENTION

1. Field of the Invention

The invention relates to a process for producing semiconductor devices and somewhat more particularly to a process of producing semiconductor devices wherein a trench or groove-like recess is produced in the surface of a Si layer and the Si surface along at least one edge of such a recess is masked with a heat-resistant oxidation-blocking or oxidation impermeable layer so that when the resultant structure is subjected to thermal oxidation, only the unmasked Si surface areas, generally within the recesses, are coated with a relatively thick $SiO_2$ layer.

2. Prior Art

*Philips Research Reports*, Vol. 25, April 1970, pages 118–132 and Vol. 26, June 1971, pages 157–165 as well as Electronics, Jan. 3, 1971, pages 52–55, suggest methods of producing semiconductor devices via a so-called local oxidation technique with the aid of silicon-nitride films and/or $SiO_2$—$Si_3N_4$ sandwich film structures whereby relatively well defined and thick oxide patterns are produced, which may be partially or fully countersunk in a Si surface. However, these prior art techniques cause an indeterminate edge condition to occur at the juncture of the Si surface and the $SiO_2$ pattern. Such indeterminate edge conditions are detrimental to the electrical characteristics of semiconductor devices containing such indeterminate edges.

SUMMARY OF THE INVENTION

The invention provides a method of producing semiconductor devices via a local oxidation technique whereby sharp, well-defined edges are provided between the Si surface and the adjacent $SiO_2$ patterns.

In accordance with the principles of the invention, semiconductor devices are produced by etching trench or groove-like recesses in a surface of a Si monocrystalline surface, masking at least one edge of the trench-like recess with a heat-resistant, oxidation blocking or oxygen impermeable strip-like layer, such as composed of $Si_3N_4$, $Al_2O_3$, BeO or $Ta_2O_5$, masking the Si surface away from the recess with a layer of $SiO_2$ so that the $SiO_2$ layer is more deeply countersunk into the Si surface than the strip-like oxidation-blocking layer and then subjecting the so-attained structure to thermal oxidation conditions so that a relatively thick oxide layer forms on the unmasked Si surface areas within the recesses. In certain embodiments, the two masking layers are removed after the thermal oxidation step and a dopant is diffused into the thus unmasked Si surface areas so as to produce at least one pn-junction.

DESCRIPTION OF THE PREFERRED EMBODIMENTS

The production of semiconductor devices, particularly integrated circuit devices, frequently involves the use of a disc-shaped substrate 1 which has, for example, on the top side thereof, an epitaxially deposited monocrystalline Si layer 2 of a given conductivity type. Generally, the substrate 1 is composed of a monocrystalline Si wafer or the like which has a conductivity opposite to that of the epitaxial layer 2. However, the substrate 1 may also be composed of a different material from that of layer 2, such as, for example, monocrystalline $Al_2O_3$, $Ta_2O_5$ or BeO.

When semiconductor devices are being produced via the local oxidation of Si technique, the free surface of the epitaxial Si layer 2 is coated with a $Si_3N_4$ layer 3, which may be pyrolytically deposited from a suitable gas phase. The thickness of layer 2 is controlled so as to be sufficient to function as a mask against $O_2$ during a subsequent thermal oxidation of the uncovered Si surface areas. For example, a $Si_3N_4$ layer may be deposited by heating a substrate-epitaxial layer arrangement in an atmosphere of $NH_3$ diluted with argon and/or hydrogen while passing a gas stream composed of $SiH_4$ diluted with argon or the like over the surface of the epitaxial layer which is to be coated. The temperature of the epitaxial layer during such a $Si_3N_4$ coating process is maintained within a range of about 700° to 1000°C. Thereafter, select local areas of the $Si_3N_4$ layer are removed from the epitaxial layer via masked-etching techniques, for example, by using a photo-lacquer etch mask and hot orthophosphoric acid as an etchant, so that a shallow trench or groove-like recess is formed, which is then deepened with the aid of a subsequent localized etching process directed at the uncovered Si surface of layer 2. In this manner, an annular trench-like or groove-like recess or recesses 4 are provided and a structure such as illustrated at FIG. 1 is attained.

Figure 1:
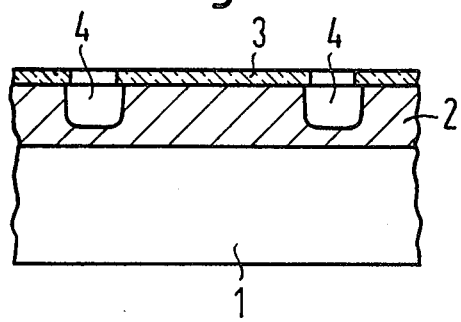
FIGS. 1 and 2 are partial elevated cross-sectional views, somewhat schematic in nature, illustrating prior art processing steps and the resultant structure.

The structure of FIG. 1 is then heated in an oxygen or in an oxygen-emitting gas so as to produce a relatively thick $SiO_2$ layer 5 in the recesses 4. Such thick $SiO_2$ layers are provided in order to produce electrically insulated zones between adjacent regions of the same conductivity type areas. Conductor paths which are applied later in the production of semiconductor devices and which are required to provide electrical connections between elements on opposite sides of the recesses may be readily deposited or placed on top of such thick $SiO_2$ layers.

Figure 2:
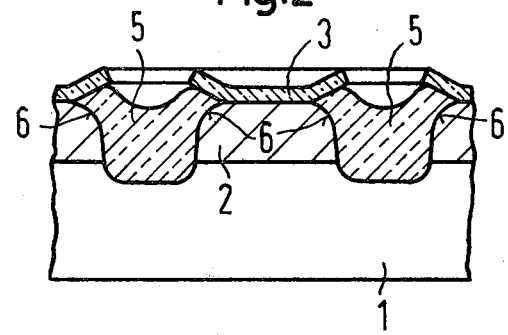

The thermal oxidation of the Si surfaces in the recesses or grooves 4 cause the formation of beak-like wedges 6 at the boundary between the $SiO_2$ layer 5 within the recesses 4 and the adjacent Si surface which is covered by the $Si_3N_4$ layer. These beak-like wedges 6 of $SiO_2$ force the peripheral edges of the $Si_3N_4$ layer 3 upwards as shown at FIG. 2. These beak-like wedges are produced by the conversion of Si at the Si surface edges adjacent the wall of the recesses into $SiO_2$ while the more remote Si surface portions are protected from thermal oxidation by the $Si_3N_4$ layer.

A study of the foregoing phenomenon clearly shows that indeterminate edge conditions are produced. Such edge conditions are particularly undesirable when one or more pn-junctions are to be located at the immediate vicinity or even directly abutting to the trench or groove-like recesses 4, which is frequently the case in compactly constructed semiconductor devices.

In accordance with the principles of the invention, such beak-like wedges at the edge of a SiO₂ layer, such as layer 5, which more or less fill the recesses 4, are avoided or at least diminished so that a more determinate edge condition is provided.

In the practice of the invention, the boundary area between the free epitaxial Si surface and the oxygen-blocking layer, which for the sake of convenience will be referred to sometimes herein as a first masking layer, is limited to a relatively narrow strip running directly at the edge of the trench-like recess. The edge of this strip which faces away from the recess is provided with a second masking layer comprised of SiO₂ and which is in direct contact with the Si surface. This second masking layer is at least partially countersunk into the Si surface so as to penetrate this surface deeper than that penetrated by the first masking layer. The so-attained structure or arrangement is then subjected to thermal oxidation conditions sufficient to oxidize the uncovered Si surfaces in the trench-like recesses and provide relatively thick SiO₂ layers therein.

The width of the oxidation-blocking or oxygen impermeable strips or first masking layer is preferably limited to a dimension about equal to the thickness of the SiO₂ layer to be produced within the recesses. The thickness of this oxidation-blocking strip is selected so as to provide sufficient O₂ impermeability during the subsequent thermal oxidation process. If, for example, the strip is formed of Si₃N₄, one must consider that this material is itself not entirely insensitive to O₂ in the presence of heat and it is slowly oxidized from the strip upper surface downwards. However, even at the high temperatures required for thermal oxidation, the Si₃N₄ oxidation process takes place very slowly so that a strip thickness in the range of 0.05 to 0.15μm is sufficient when the strip or first mask is composed of Si₃N₄. Other materials suitable for forming the strips or first mask layers are certain oxides which have a small lattice spacing or have amorphous structures, such as, for example, Ta₂O₅, Nb₂O₅, Al₂O₅ and BeO.

In instances where a deeper penetration of the SiO₂ layer which forms the second mask is to be prevented, which in certain embodiments may be desirable, it is suggested that such SiO₂ layer be coated with an oxidation impermeable material, which may be identical or different from the oxidation-blocking material forming the strip or first mask layer.

Further details of the invention will now be described in conjunction with FIGS. 3 and 4. In these illustrations, elements similar to those in FIGS. 1 and 2 have been designated with identical reference numerals. Thus, the semiconductor arrangement of FIGS. 3 and 4 comprises a disc-shaped substrate 1 with an epitaxial monocrystalline Si layer 2 thereon. The first mask is then applied onto this semiconductor arrangement, preferably over the entire surface of layer 2. The preferred material for this first mask is Si₃N₄ although other oxidation-blocking or oxygen impermeable materials may also be used.

Generally, the epitaxial layer 2 will be divided up into a number of separate zones isolated from one another, each of which are destined to accommodate one element of an integrated circuit being produced on the semiconductor arrangement. In many of such instances, the trench-like or groove-like recesses 4 are formed so as to define a lattice-like network or to define a plurality of separate rings, each of which surrounds an island composed of a Si surface. These recesses are subsequently lined or filled as much as possible with a thick, thermally produced, SiO₂ layer 5. Accordingly, the oxidation-blocking layer 3 is selectively etched with a suitable etchant technique so as to form ring-shaped or frame-shaped strips 3a which are separate from one another and are located at the edge of the recesses 4. In instances where the system of recesses forms a lattice-like network, the frame-like strips 3a are discrete and parallel to one another so that the strips leave uncovered between them those Si areas of layer 2 which must be removed during the etching of recesses 4. Alternatively, it is also possible to provide an irregular arrangement of the elements in the integrated circuit being produced on the epitaxial layer 2. In those instances, the zones of layer 2 which are to be processed to form the individual circuit elements are each surrounded with a discrete annular recess 4. However, this form of construction means that the oxidation-blocking strips 3a need only be provided on the inner edge or bank of the recesses.

It is important to control the width of the strips 3a so that each such strip is approximately equal to the sum of the recess depth and half of the thickness of the SiO₂ layer which is yet to be formed within the recesses. Also, the islands of Si surface remaining between or within the recesses 4 should be of such a size that space is available for the strips 3a to extend directly from the bank or edge of the recesses 4 into the interior of the Si-islands as well as for the second mask 7. The same considerations are applicable to the thickness and material properties for the layer 3 and for the first mask or strips 3a.

After the production of the annular or frame-like oxidation-blocking strips, for example, by a conventional photo-lacquer etching technique, the resultant arrangement, in accordance with the principles of the invention, is subjected to a thermal oxidation process at such conditions that the strips 3a remain (i.e. they are not themselves oxidized). In other words, the oxidation of, for example, the Si₃N₄ strips should be avoided as much as possible, for example, by utilizing lower oxidation temperatures.

The SiO₂ layer which forms the second mask 7, may also be pyrolytically deposited from a suitable gaseous mixture. In such instances, the Si-islands surrounded by the strips 3a must first be etched away somewhat so that the SiO₂ of the second mask extends deeper into the Si surface of layer 2 than the strips 3a (and in fact by a depth of about 1/10 of the SiO₂ layer thickness which is produced in the recesses 4). It is pointed out that in the production of mask 7, the normally exposed areas of the silicon surface of layer 2, i.e. at the desired location of the recesses 4, which are yet to be produced, are also covered with the SiO₂ of mask 7. It is then preferable, for example, by using an appropriately shaped etch mask, to remove not only the SiO₂ layer at the location of the recesses but also from the strips 3a before any further processing steps are undertaken.

Preferably, although not necessarily, the portions of the SiO₂ layer which functions as the second mask 7 are covered with another layer 8. The layer 8, which may be composed of Si₃N₄ or some other oxidation-blocking material (or even SiO₂), functions to de-accelerate the advancement of mask 7 as by oxidation, in the walls of the recesses 4, which are yet to be produced. The layer 8 may, typically, be applied directly after the process step that forms the second mask 7.

The resultant arrangement or structure now comprises the surface of the silicon layer 2 having ring-shaped or frame-like strips 3a composed of an oxygen impermeable or oxidation-blocking material, such as $Si_3N_4$, which form the first mask and each such strip surrounds a Si-island which is completely covered with a $SiO_2$ layer (thus of the second mask 7) directly adjoining the mask 7. The layer 8, which may still have to be provided, is actually only required for covering the second mask 7. If a conventional process is utilized to produce layer 8 (i.e. pyrolytic deposition from a suitable $SiH_4$—$NH_3$ mixture diluted, for example, with an inert gas onto the heated surface of the structure) it will result in that initially, the entire surface of the so-treated structure or arrangement is covered with the layer 8.

In order to produce the recesses 4, it is necessary to first etch away the excess material of the previously applied layers 8 and 7, respectively, at the desired location of the recesses. This may be expediently effected via a suitable photo-lacquer etch technique. Then, the recesses 4 are produced in a conventional manner, again using a photo-lacquer etch technique. An individual recess 4 should be etched in such a manner that at least one of its banks or peripheral walls coincides directly (and in fact over its entire length) with a facing edge of an associated strip 3a. Since an individual recess 4 is usually ring-shaped or frame-shaped, it surrounds an associated ring-shaped or frame-like strip 3a without a gap therebetween, just as the strip 3a itself surrounds an insular portion of the second mask 7 without a gap therebetween.

Figure 3:
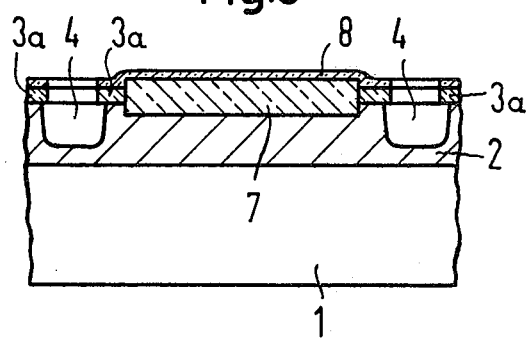
FIGS. 3 and 4 are somewhat similar views to those of FIGS. 1 and 2 and illustrate the process of the invention and the resultant structure.
Figure 4:
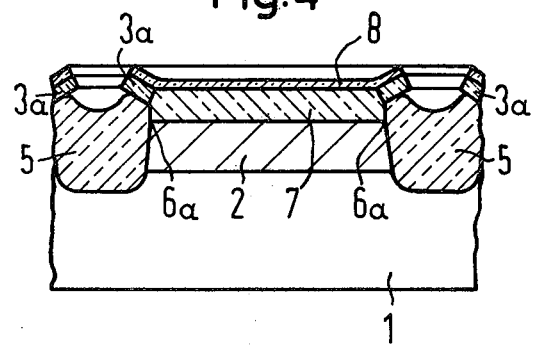

After the recess or recesses 4 are produced, a structure or arrangement as shown in FIG. 3 is attained. Such a structure is then subjected in a known manner to a thermal oxidation process whereby the masks 3 and 7 limit the oxidation process to the free or uncovered Si surfaces in the recesses 4. In this manner, a relatively thick $SiO_2$ layer 5 is formed within the recesses so that a structure such as shown at FIG. 4 is attained. The undesirable wedge-shaped projections at points 6a (such wedge-shaped projections have been referred to in the relevant art as "beaks"), have been intercepted or blocked by the second mask 7 and no longer occur.

Figure 5:
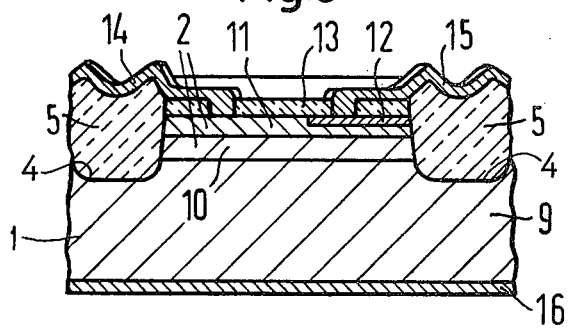
FIG. 5 is a partial cross-sectional view of an exemplary embodiment of a semiconductor device produced in accordance with the principles of the invention.

A preferred further treatment of the resultant structure may then be commenced so as to obtain a structure such as shown at FIG. 5. This structure represents the production of a transistor wherein the substrate 1, which may be comprised of a highly doped monocrystalline Si body 9, is provided with a more weakly doped epitaxial layer 2 of the same conductivity type as that of the substrate. A collector zone 10, a base zone 11 and an emitter zone 12 for the transistor are conventionally produced in the layer 2 via masked diffusion techniques.

In order to accomplish this, first the layer 8, then the mask 7 and then the strips 3a are removed by a suitable etching process which attacks the particular materials forming the individual layers. Thereafter, the layer 5 within the recesses 4 is covered with an etch mask consisting of a photo-lacquer material. After the removal of this etch mask, in the instant embodiment, a base-collector pn-junction is produced which extends transversely through the Si-island surrounded by the annular recess 4. During such pn-junction production and assuming a suitable doping material is used, the $SiO_2$ layer 5 within the recesses 4 may be utilized as a diffusion mask. Expediently, the base doping is diffused in or produced under oxidizing conditions so that on the surface of the Si-island an oxide layer forms, which to a certain extent replaces the mask 7 but such oxide layer functions entirely different from the function of mask 7. This oxide layer functions, in fact, in the subsequent production of the emitter zone 12 as a basis for the diffusion mask required in the production of such emitter zone and as a passivation layer for the emitter-base pn-junction. Generally, the emitter zone 12 and the base zone 11 are produced under oxidizing conditions. Accordingly, in order to contact the zones 11 and 12, it is necessary in each case to etch a contact window in the regenerated $SiO_2$ layer 13 to the underlying Si surface via a photo-lacquer etching technique. In the exemplary embodiment shown, a portion of the diffusion mask required for the production of the emitter zone 12 is directly formed by the relatively thick $SiO_2$ layer 5 which fills the trench or groove-like recesses 4. In this manner, both the base zone 11 and the emitter zone 12 abut, at least in part, directly onto the $SiO_2$ layer 5. Thus, at least a zone of the Si-island surrounded by the recess 4 is substantially exploited for the base zone and the emitter zone of the transistor. In a conventional prior art arrangement, i.e. one without the second mask 7, such an exploitation could not be readily insured because of the undeterminable or changeable location of the wedge-shaped edge of layer 5 in relation to the oxidation-blocking layer 3.

Next, the highly doped Si body 9 is provided with a collector electrode 16, the base zone 11 is provided with a base electrode 14 and the emitter zone 12 is provided with an emitter electrode 15. As shown, electrodes 14 and 15 extend in part as conductive paths over the adjacent surfaces of the $SiO_2$ layer 5 within the recesses 4 and thus produce the electric connection between the transistor and further elements of an integrated semiconductor circuit wherein the transistor of FIG. 5 is only a single element or component.

The width of the ring-shaped or frame-shaped strips 3a, which may be provided via deposition of a uniform layer 3 composed of $Si_3N_4$ or a similar oxidation-obstructing material and removing unwanted portions thereof via etching, is typically regulated so as to be about 2 to 3 $\mu$m. This width dimension corresponds approximately to the depth of the recesses 4 plus half of the thickness of the $SiO_2$ layer 5 provided within such recesses. The thickness of the $SiO_2$ mask 7 is expediently set at about 2000 to 6000 AE. In this manner, the mask 7 extends more deeply into the silicon surface 2 than the first mask layer or strip 3a by about 1000 to 3000 A.

In instances where the layer 8 is composed of $SiO_2$ (which has been deposited from a suitable gas) it may be removed via a dilute hydrofluoric acid solution, preferably one which has been buffered with $NH_4F$, since this etchant does not generally attack the oxidation-blocking material of strips 3a. Accordingly, it is only necessary to protect or cover the $SiO_2$ layer 5 within the recesses 4. When ring-shaped or frame-shaped strips 3a are formed of $Si_3N_4$, a suitable etchant therefor is hot $H_3PO_4$ and for which no mask is required. In instances where the layer 8 is composed of $Si_3N_4$, such layer 8 and strips 3a may be removed without the use of a mask in a single etching process with hot $H_3PO_4$.

Then, if an arrangement or structure such as shown at FIG. 5 is desired, the mask 7 is etched away via dilute hydrolfuoric acid solution after the oxide layer 5 within the recess 4 has been covered with a photo-lacquer. In instances where it is not desired to position the pn-junctions in direct abutting relation to the oxide layer 5, the second mask 7 is expediently used as a base for the production of at least one pn-junction. Thus, the mask 7 remains on the surface of the structure as a mask and, on occasion, as a passivation layer so that the mask may be provided with suitable diffusion windows in a known manner from planar transistor production techniques. It should be clear to those skilled in the art that the structure shown at FIG. 4 may also be processed in a variety of other techniques from those described above.

The thermal oxidation process used in producing the $SiO_2$ layer 5 is regulated so that the lower edge of the wedge or beak which tends to form during the growth of the layer 5 coincides with the lower edge of the second mask 7 when the oxide layer 5 is fully formed within the recesses 4. In this manner, determinate edge conditions are always ensured. The dimensions set forth earlier provide a means of achieving this coincidence, at least with good approximation.

The foregoing is considered as illustrative only of the principles of the inventon. Further, since numerous modifications and changes will readily occur to those skilled in the art, it is not desired to limit the invention to the exact construction and process shown and described and accordingly all suitable modifications and equivalents may be resorted to, falling within the scope of the invention as claimed.

We claim as our invention:

1. In a process for producing a semiconductor device wherein a trench-like recess is formed in the surface of a Si crystal, a heat-resistant oxidation-blocking layer is applied onto the Si surface at least along one edge of said recess and the Si surface within said recess free of said oxidation-blocking layer is coated with a relatively thick $SiO_2$ layer via thermal oxidation, the improvement comprising:
    confining said heat-resistant oxidation-blocking layer to a strip running directly along the edge of said recess;
    applying a layer of $SiO_2$ directly onto the Si surface at the edge of said oxidation-blocking strip facing away from said recess, said layer of $SiO_2$ projecting into said Si surface more deeply than said oxidation-blocking strip; and
    subjecting the so-obtained structure to thermal oxidation conditions sufficient to grow a relatively thick $SiO_2$ layer onto the uncovered Si surface within said recess.

2. In a process as defined in claim 1 wherein said trench-like recess has an annular shape which possesses a uniform depth and surrounds an island formed of said Si surface, a peripheral edge of said island being covered with said oxidation-blocking strip and the remaining surface of said island being coated with said layer of $SiO_2$ so as to abut against said strip.

3. In a process as defined in claim 1 wherein said oxidation-blocking strip is confined to a width approximately equal to the sum of the depth of said recess and half of the thickness of the $SiO_2$ layer within said recess.

4. In a process as defined in claim 3 wherein said oxidation-blocking strip is confined to a width in the range of about 2 to $3\mu m$ and to a thickness of about 0.05 to $0.15\mu m$.

5. In a process as defined in claim 3 wherein said layer of $SiO_2$ applied onto the Si surface at the edge of said oxidation-blocking strip is applied in a thickness of about 2000 to 6000 A.

6. In a process as defined in claim 5 wherein said layer of $SiO_2$ applied onto the Si surface at the edge of said oxidation-blocking strip projects about 0.1 to $0.3\mu m$ deeper into the Si surface than said oxidation-blocking strip.

7. In a process as defined in claim 1 wherein said subjecting step is preceded by an application of a uniform layer onto said oxidation-blocking strip and onto said $SiO_2$ layer which deaccelerates the penetration of said $SiO_2$ layer at the cost of silicon.

8. In a process as defined in claim 7 wherein said uniform layer is composed of a material selected from the group consisting of $Si_3N_4$, $Al_2O_3$, BeO, $Ta_2O_5$ and $SiO_2$.

9. In a process as defined in claim 1 wherein said oxidation-blocking strip is composed of a material selected from the group consisting of $Si_3N_4$, $Al_2O_3$, BeO and $Ta_2O_5$.

10. In a process as defined in claim 1 including removing said oxidation-blocking strip and said $SiO_2$ layer after the thermal oxidation process is completed and diffusing a dopant into the thus uncovered Si surface to produce at least one pn-junction.

11. In a process as defined in claim 10 wherein the relatively thick $SiO_2$ layer produced within said recess defines a diffusion window in the production of at least one pn-junction.

* * * * *